United States Patent
Seo

(10) Patent No.: US 9,899,122 B2
(45) Date of Patent: Feb. 20, 2018

(54) DISPLAY DEVICE CONNECTED BY ANISOTROPIC CONDUCTIVE FILM

(71) Applicant: SAMSUNG SDI CO., LTD., Yongin-si, Gyeonggi-do (KR)

(72) Inventor: Hyun Joo Seo, Suwon-si (KR)

(73) Assignee: SAMSUNG SDI CO., LTD., Yongin-si, Gyeonggi-Do (KR)

( * ) Notice: Subject to any disclaimer, the term of this patent is extended or adjusted under 35 U.S.C. 154(b) by 121 days.

(21) Appl. No.: 14/950,231

(22) Filed: Nov. 24, 2015

(65) Prior Publication Data

US 2016/0155529 A1    Jun. 2, 2016

(30) Foreign Application Priority Data

Nov. 27, 2014 (KR) .................. 10-2014-0167165

(51) Int. Cl.
  *H01B 1/20* (2006.01)
  *H01L 23/482* (2006.01)
  *H05K 3/32* (2006.01)

(52) U.S. Cl.
  CPC ........... *H01B 1/20* (2013.01); *H01L 23/4828* (2013.01); *H05K 3/323* (2013.01); *H01L 2224/83851* (2013.01)

(58) Field of Classification Search
  None
  See application file for complete search history.

(56) References Cited

U.S. PATENT DOCUMENTS

| | | | |
|---|---|---|---|
| 2009/0078747 A1* | 3/2009 | Park ..................... | C09J 4/00 228/249 |
| 2013/0113119 A1* | 5/2013 | Namkung ............ | C09J 133/068 257/783 |
| 2014/0179065 A1* | 6/2014 | Lee ..................... | H01L 24/83 438/119 |

FOREIGN PATENT DOCUMENTS

| | | |
|---|---|---|
| CN | 103834319 A | 6/2014 |
| JP | 1999-236540 | 8/1999 |
| KR | 10-2007-0065800 A | 6/2007 |
| KR | 10-2013-0068892 A | 6/2013 |
| TW | 201226518 A | 7/2012 |
| TW | 201229115 A | 7/2012 |
| TW | 201606045 A | 2/2016 |

OTHER PUBLICATIONS

Taiwanese Office Action dated Oct. 25, 2016 for corresponding Taiwanese Patent Application No. 104139530; SEO.

* cited by examiner

*Primary Examiner* — Katie L Hammer
(74) *Attorney, Agent, or Firm* — Lee & Morse, P.C.

(57) ABSTRACT

A display device connected by an anisotropic conductive film, wherein the anisotropic conductive film has a first z-axis length variation rate of 10% to 90%, as measured using a thermo-mechanical analyzer and calculated according to Equation 1:

first z-axis length variation rate=$[(L_1-L_0)/L_0] \times 100$
(%)                                                                 (1), wherein, $L_0$ is a z-axis length of the anisotropic conductive film at a heating start temperature, and $L_1$ is a maximum z-axis length of the anisotropic conductive film at 130° C. to 170° C. after being heated, as measured using the thermo-mechanical analyzer.

14 Claims, 1 Drawing Sheet

[Fig. 1]
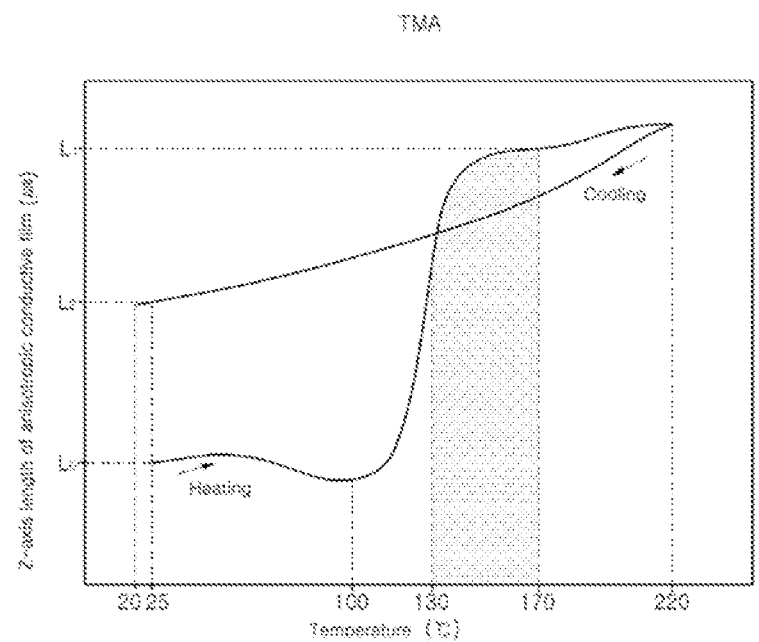
[Fig. 2]
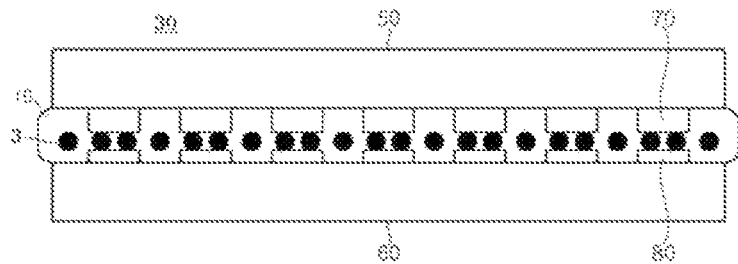

DISPLAY DEVICE CONNECTED BY ANISOTROPIC CONDUCTIVE FILM

CROSS-REFERENCE TO RELATED APPLICATION

Korean Patent Application No. 10-2014-0167165, filed on Nov. 27, 2014, in the Korean Intellectual Property Office, and entitled: "Display Device Connected by Anisotropic Conductive Film," is incorporated by reference herein in its entirety.

1. FIELD

Embodiments relate to a display device connected by an anisotropic conductive film.

2. DESCRIPTION OF THE RELATED ART

Anisotropic conductive films (ACFs) refer to film-shaped adhesives prepared by dispersing conductive particles in a resin such as an epoxy resin. An anisotropic conductive film may be composed of polymer layers having electric anisotropy and adhesion, and may exhibit conductive properties in the thickness direction of the film and insulating properties in the surface direction thereof. When an anisotropic conductive film disposed between circuit boards to be connected is subjected to heating and compression under certain conditions, circuit terminals of the circuit boards may be electrically connected through conductive particles and an insulating adhesive resin fills spaces between adjacent electrodes to isolate the conductive particles from each other, thereby providing high insulation performance.

SUMMARY

Embodiments are directed to a display device connected by an anisotropic conductive film.

The embodiments may be realized by providing a display device connected by an anisotropic conductive film, wherein the anisotropic conductive film has a first z-axis length variation rate of 10% to 90%, as measured using a thermo-mechanical analyzer and calculated according to Equation 1:

$$\text{first } z\text{-axis length variation rate} = [(L_1-L_0)/L_0] \times 100 \text{ (\%)} \quad (1),$$

wherein, $L_0$ is a z-axis length of the anisotropic conductive film at a heating start temperature, and $L_1$ is a maximum z-axis length of the anisotropic conductive film at 130° C. to 170° C. after being heated, as measured using the thermo-mechanical analyzer.

The anisotropic conductive film may have a second z-axis length variation rate of −10% to +60%, as measured using a thermo-mechanical analyzer and calculated according to Equation 2:

$$\text{second } z\text{-axis length variation rate} = [(L_2-L_0)/L_0] \times 100 \text{ (\%)} \quad (2),$$

wherein, $L_0$ is the z-axis length of the anisotropic conductive film at the heating start temperature, and $L_2$ is a z-axis length of the anisotropic conductive film at 25° C., as measured using the thermo-mechanical analyzer after being heated to 220° C. and cooled to 20° C.

The anisotropic conductive film may have a minimum melt viscosity of 20,000 Pa·sec or less.

The anisotropic conductive film may have an adhesive strength of 500 gf/cm or more, as measured after preliminary compression under conditions of 70° C., 1.0 MPa and 1 second and main compression under conditions of 150° C., 3.0 MPa and 5 second.

The anisotropic conductive film may have a ratio of bubble area in a space between electrodes to total area of the space of 15% or less, as measured after being left at 85° C. and 85% RH for 500 hours subsequent to preliminary compression under conditions of 70° C., 1.0 MPa and 1 second and main compression under conditions of 150° C., 3.0 MPa and 5 second.

The anisotropic conductive film may be prepared from a composition that includes a binder resin; 2-hydroxy-3-phenoxypropyl acrylate; a curing initiator; and conductive particles.

The 2-hydroxy-3-phenoxypropyl acrylate may be present in the composition in an amount of 10 wt % to 50 wt %.

The binder resin may have a glass transition temperature of −10° C. to 90° C.

A weight ratio of the binder resin to the 2-hydroxy-3-phenoxypropyl acrylate may be 8:1 to 1:1.

The binder resin may have a weight average molecular weight of 90,000 g/mol or less.

The binder resin may include at least two binder resins having different molecular weights.

The binder resin may include at least one binder resin having a weight average molecular weight of 20,000 g/mol to 50,000 g/mol, and at least one binder resin having a weight average molecular weight of greater than 50,000 g/mol to 90,000 g/mol.

The embodiments may be realized by providing a display device connected by an anisotropic conductive film, wherein the anisotropic conductive film is prepared from a composition that includes a binder resin having a glass transition temperature of −10° C. to 90° C. and a weight average molecular weight of 90,000 g/mol or less; a radical polymerizable material that includes 2-hydroxy-3-phenoxypropyl acrylate; a curing initiator; and conductive particles, and wherein the anisotropic conductive film has a z-axis length variation rate of −10% to 60%, as measured using a thermo-mechanical analyzer and calculated according to Equation 2:

$$\text{second } Z\text{-axis length variation rate} = [(L_2-L_0)/L_0] \times 100 \text{ (\%)} \quad (2),$$

wherein, $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and cooled to 20° C.

The 2-hydroxy-3-phenoxypropyl acrylate may be present in the composition in an amount of 10 wt % to 50 wt %, in terms of solid content.

A weight ratio of the binder resin to the 2-hydroxy-3-phenoxypropyl acrylate may be 8:1 to 1:1.

The composition may include 20 wt % to 70 wt % of the binder resin; 10 wt % to 50 wt % of the radical polymerizable material that includes 2-hydroxy-3-phenoxypropyl acrylate; 1 wt % to 10 wt % of the curing initiator; and 1 wt % to 20 wt % of the conductive particles.

The embodiments may be realized by providing an anisotropic conductive film including a binder resin having a glass transition temperature of −10° C. to 90° C. and a weight average molecular weight of 90,000 g/mol or less; a radical polymerizable material that includes 2-hydroxy-3-phenoxypropyl acrylate; a curing initiator; and conductive particles, and wherein the anisotropic conductive film has a z-axis length variation rate of −10% to 60%, as measured using a thermo-mechanical analyzer and calculated according to Equation 2:

$$\text{second Z-axis length variation rate} = [(L_2-L_0)/L_0] \times 100 \ (\%) \quad (2),$$

wherein, $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and cooled to 20° C.

BRIEF DESCRIPTION OF THE DRAWINGS

Features will be apparent to those of skill in the art by describing in detail exemplary embodiments with reference to the attached drawings in which:

FIG. 1 illustrates a graph showing lengths $L_0$ to $L_2$ of an anisotropic conductive film according to one embodiment upon heating and cooling with a thermo-mechanical analyzer.

FIG. 2 illustrates a sectional view of a display device according to an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

One embodiment relates to a display device connected by an anisotropic conductive film which has a first z-axis length variation rate of 10% to 90%, as measured using a thermo-mechanical analyzer and calculated according to Equation 1.

$$\text{First z-axis length variation rate} = [(L_1-L_0)/L_0] \times 100 \ (\%) \quad (1)$$

In Equation 1, $L_0$ is a z-axis length of the anisotropic conductive film at a heating start temperature, and $L_1$ is a maximum z-axis length of the anisotropic conductive film at 130° C. to 170° C. after being heated, as measured using the thermo-mechanical analyzer.

In an implementation, the anisotropic conductive film may have a first z-axis length variation rate of 20% to 85%, e.g., 30% to 85%, as calculated by Equation 1.

Maintaining the first z-axis length variation rate of the anisotropic conductive film as calculated by Equation 1 at 10% or greater helps reduce and/or prevent the generation of bubbles are after compression or reliability evaluation, the anisotropic conductive film may sufficiently fill a space between electrodes. Maintaining the first z-axis length variation rate of the anisotropic conductive film as calculated by Equation 1 at 90% or less may help ensure that the anisotropic conductive film does not expand in the z-axis direction during curing and may help ensure that conductive particles may be properly brought into contact with the electrodes, thereby preventing an increase in connection resistance and facilitating the anisotropic conductive function of the film.

Measuring the first z-axis length variation rate of the film using a thermo-mechanical analyzer may be performed according to a suitable method. For example, the first z-axis length variation rate of the anisotropic conductive film may be measured in a compression mode using a differential scanning calorimeter Model Q20 (TA Instruments) at a heating rate of 10° C./min from 25° C. to 220° C. under a pressure of 0.05N.

In an implementation, the heating start temperature may be from 20° C. to 25° C., more specifically 25° C.

As used herein, the z-axis length of the anisotropic conductive film refers to a thickness of the film in a direction in which the film is compressed between electrodes.

In an implementation, the anisotropic conductive film may have a second z-axis length variation rate of −10% to +60%, as measured using a thermo-mechanical analyzer and calculated according to Equation 2.

$$\text{second Z-axis length variation rate} = [(L_2-L_0)/L_0] \times 100 \ (\%) \quad (2)$$

In Equation 2, $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and then cooled to 20° C.

In an implementation, the anisotropic conductive film may have a second z-axis length variation rate of −10% to +60%, more specifically −8% to +58%, as calculated by Equation 2. Within this range, the anisotropic conductive film may help reduce thermal deformation due to expansion and contraction by heating and cooling, and thus may help reduce bubbling and have improved adhesion, thereby exhibiting improved reliability.

The anisotropic conductive film may have a ratio of bubble area in a space between electrodes to total area of the space of 10% or less, e.g., 9% or less or 8% or less, as measured after preliminary compression under conditions of 70° C., 1.0 MPa and 1 second and main compression under conditions of 150° C., 3.0 MPa and 5 second. In an implementation, the anisotropic conductive film may have a ratio of bubble area in a space between electrodes to total area of the space after reliability evaluation of 15% or less, e.g., 12% or less or 9% or less, as measured after being left at 85° C. and 85% RH for 500 hours subsequent to compression under the above conditions.

The bubble area in the space between the electrodes may be measured by a suitable method. For example, after the anisotropic conductive is subjected to preliminary compression under conditions of 70° C., 1.0 MPa and 1 second and main compression under conditions of 150° C., 3.0 MPa and 5 second, the space between the electrodes may be observed (or photographed) using a microscope, followed by calculating the ratio of bubble area in the space between the electrodes to total area of the space using an image analyzer or a calibrated grid sheet.

The anisotropic conductive film may have a minimum melt viscosity of 20,000 Pa·sec or less, e.g., 10,000 Pa·sec or less. Within this range, the anisotropic conductive film may exhibit excellent properties in terms of flowability and connection reliability. When an adhesive is heated, initially, viscosity of the adhesive may gradually decrease due to increase in temperature. When a certain temperature is reached, the adhesive may melt and exhibit a minimum viscosity. As used herein, the minimum melt viscosity refers to viscosity at the certain temperature. Thereafter, when the adhesive is further heated, the adhesive may undergo curing and may gradually increase in viscosity. When the adhesive is completely cured, the adhesive may have a substantially constant viscosity.

By way of example, the minimum melt viscosity of the anisotropic conductive film may be measured on a parallel plate and a disposable aluminum plate (diameter: 8 mm) using an ARES G2 rheometer (TA Instruments) under conditions of a temperature elevation rate of 10° C./min, a strain of 5%, and a frequency of 1 rad/sec in a temperature zone from 30° C. to 200° C.

In an implementation, the anisotropic conductive film may have an adhesive strength of 500 gf/cm or more, e.g., 600 gf/cm or more, as measured after preliminary compression under conditions of 70° C., 1.0 MPa and 1 second and main compression under conditions of 150° C., 3.0 MPa and 5 second. The adhesive strength of the anisotropic conductive film may be measured by a suitable method.

By way of example, after the anisotropic conductive film is subjected to preliminary compression under conditions of 70° C., 1.0 MPa and 1 second and main compression under conditions of 150° C., 3.0 MPa and 5 second, adhesive strength of the anisotropic conductive may be measured using a peel strength meter (H5KT, Tinius Olsen Co., Ltd.) under conditions of a peeling angle of 90° and a peeling speed of 50 mm/min.

Maintaining the adhesive strength of the film at 500 gf/cm or greater helps ensure that a display device using the same is useable for a long time and thus has a sufficient lifespan.

Another embodiment relates to a display device connected by an anisotropic conductive film which has a first z-axis length variation rate of 10% to 90%, as measured using a thermo-mechanical analyzer and calculated according to Equation 1 and includes, e.g., a binder resin; 2-hydroxy-3-phenoxypropyl acrylate; a curing initiator; and conductive particles.

The first z-axis length variation rate of the anisotropic conductive film is the same as defined above.

2-hydroxy-3-phenoxypropyl acrylate may be represented by Formula 1, below, and may be present in the anisotropic conductive film composition in an amount of 10 wt % to 50 wt %, in terms of solid content.

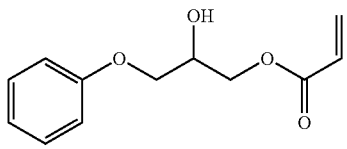

<Formula 1>

Within this content range of 2-hydroxy-3-phenoxypropyl acrylate, the anisotropic conductive film may exhibit good properties in terms of bubbling prevention and reduction in connection resistance.

2-hydroxy-3-phenoxypropyl acrylate may exhibit low contraction in a direction perpendicular to a longitudinal direction of an electrode during curing, and thus may help effectively prevent bubbling of the film in a space between electrodes when used together with a binder resin having a glass transition temperature of −10° C. to 90° C. and/or a weight average molecular weight of 90,000 g/mol or less.

In an implementation, the anisotropic conductive film may further include a suitable radical polymerizable material. The radical polymerizable material may include, e.g., acrylates, methacrylates, maleimide compounds, and the like, and may be provided in the form of a monomer, an oligomer, a polymer, or a combination thereof.

Examples of the acrylates or methacrylates may include methyl acrylate, ethyl acrylate, 4-hydroxybutyl acrylate, isopropyl acrylate, isobutyl acrylate, ethylene glycol diacrylate, diethylene glycol diacrylate, trimethylolpropane triacrylate, tetramethylolmethane tetraacrylate, 2-hydroxy-1,3-diacryloxypropane, 2,2-bis[4-(acryloxypolymethoxy)phenyl]propane, 2,2-bis[4-(acryloxypolyethoxy)phenyl]propane, dicyclopentenyl acrylate, tricyclodecanyl acrylate, tris(acryloyloxyethyl) isocyanurate, tricyclodecane dimethanol diacrylate, 2-methacryloyloxy phosphate, pentaerythritol tri(meth)acrylate, and 2-hydroxy ethyl (meth)acrylate. These may be used alone or in combination thereof.

The maleimide compounds may be maleimide compounds that contain at least two maleimide groups per molecule. For example, the maleimide compounds may include 1-methyl-2,4-bismaleimide benzene, N,N'-m-phenylenebismaleimide, N,N'-p-phenylenebismaleimide, N,N'-m-toluene bismaleimide, N,N'-4,4-biphenylenebismaleimide, N,N'-4,4-(3,3'-dimethyl-biphenylene)bismaleimide, N,N'-4,4-(3,3'-dimethyldiphenylmethane)bismaleimide, N,N'-4,4-(3,3'-diethyldiphenylmethane)bismaleimide, N,N'-4,4-diphenylmethanebismaleimide, N,N'-4,4-diphenylpropanebismaleimide, N,N'-4,4-diphenyl ether bismaleimide, N,N'-3,3'-diphenyl sulfone bismaleimide, 2,2-bis[4-(4-maleimidophenoxy)phenyl) propane, 2,2-bis[3-s-butyl-4,8(4-maleimidophenoxy)phenyl]propane, 1,1-bis[4-(4-maleimidophenoxy)phenyl]decane, 4,4'-cyclohexylidene-bis[1-(4-maleimidophenoxy)-2-cyclo hexyl]benzene, and 2,2-bis[4-(4-maleimidophenoxy)phenyl]hexafluoropropane. These may be used alone or in combination thereof.

Examples of the binder resin may include polyimide resins, polyamide resins, phenoxy resins, polymethacrylate resins, polyacrylate resins, polyurethane resins, polyester resins, polyester urethane resins, polyvinyl butyral resins, styrene-butadiene-styrene (SBS) resins and epoxylated modifications thereof, styrene-ethylene/butylene-styrene (SEBS) resins and modifications thereof, and the like. These may be used alone or in combination thereof.

The binder resin may have a weight average molecular weight of 90,000 g/mol or less. Maintaining the weight average molecular weight of the binder resin at 90,000 g/mol or less may help ensure that expansion of 2-hydroxy-3-phenoxypropyl acrylate is not impeded. In an implementation, the anisotropic conductive film may include at least two binder resins having a weight average molecular weight of 90,000 g/mol or less and being different in weight average molecular weight. For example, the anisotropic conductive film may include at least one binder resin having a weight average molecular weight of 20,000 g/mol to 50,000 g/mol and at least one binder resin having a weight average molecular weight of greater than 50,000 g/mol to 90,000 g/mol. When the anisotropic conductive film includes at least two binder resins having different weight average molecular weights, the anisotropic conductive film may exhibit good properties in terms of flowability and expansibility.

The binder resin may have a glass transition temperature of −10° C. to 90° C., e.g., 0° C. to 80° C. or 10° C. to 70° C. Maintaining the glass transition temperature of the binder resin at −10° C. or greater helps ensure that the anisotropic conductive film has sufficient resistance to contraction and expansion. Maintaining the glass transition temperature of the binder resin at 90° C. or less may help ensure that the resin has sufficient flowability, thereby reducing and/or preventing a deterioration in connection reliability. Measurement of the glass transition temperature (Tg) may be performed using suitable equipment and methods. By way of example, after a solvent in the binder resin is evaporated to solidify the resin, glass transition temperature of the binder resin may be measured using a thermo-mechanical analyzer (TA Instruments) under conditions of a temperature elevation rate of 10° C./min and a temperature zone of −40° C. to 200° C.

In an implementation, the binder resin may be present in the anisotropic conductive film composition in an amount of 20 wt % to 70 wt %, e.g., 30 wt % to 70 wt %, in terms of solid content. Within this range, the binder resin may help improve flowability and adhesion of an anisotropic conductive film composition.

A weight ratio of the binder resin to 2-hydroxy-3-phenoxypropyl acrylate may be 8:1 to 1:1. In an implementation, the weight ratio may be 6:1 to 1:1, e.g., 3:1 to 1:1. Within this range, the anisotropic conductive film may help secure expansibility at a main compression temperature while having excellent adhesion.

The anisotropic conductive film may further include an ethylene-vinyl acetate (EVA) copolymer. An ethylene-vinyl acetate copolymer is a thermoplastic resin obtained by copolymerization of ethylene and vinyl acetate, and may help improve flowability and adhesion of a composition. In an implementation, vinyl acetate may be present in the ethylene-vinyl acetate copolymer in an amount of 15 wt % to 35 wt %. Within this content range of vinyl acetate, the anisotropic conductive film may have good adhesion while exhibiting good properties in terms of elastic modulus and reliability.

The curing initiator may include a suitable curing initiator. The curing initiator may function as a curing agent generating free radicals by heat or light, and may include, e.g., an organic peroxide.

The organic peroxide may include, e.g., ketone peroxides, peroxy ketals, hydro-peroxides, dialkyl peroxides, diacyl peroxides, peroxy esters, and peroxy carbonates. The organic peroxide may include two or more peroxides selected by taking into account connection temperature and time and storage stability of a product.

For example, the organic peroxide may include t-butyl peroxy laurate, 1,1,3,3-t-methylbutylperoxy-2-ethylhexanoate, 2,5-dimethyl-2,5-di(2-ethylhexanoylperoxy)hexane, 1-cyclohexyl-1-methylethylperoxy-2-ethylhexanoate, 2,5-dimethyl-2,5-di(m-toluoylperoxy)hexane, t-butyl peroxy isopropyl monocarbonate, t-butyl peroxy-2-ethylhexyl monocarbonate, t-hexyl peroxy benzoate, t-butyl peroxy acetate, dicumyl peroxide, 2,5,-dimethyl-2,5-di(t-butyl peroxy)hexane, t-butyl cumyl peroxide, t-hexyl peroxy neodecanoate, t-hexyl peroxy-2-ethyl hexanoate, t-butyl peroxy-2-2-ethylhexanoate, t-butyl peroxy isobutyrate, 1,1-bis(t-butyl peroxy)cyclohexane, t-hexyl peroxyisopropyl monocarbonate, t-butyl peroxy-3,5,5-trimethyl hexanoate, t-butyl peroxy pivalate, cumyl peroxy neodecanoate, di-isopropyl benzene hydroperoxide, cumene hydroperoxide, isobutyl peroxide, 2,4-dichloro benzoyl peroxide, 3,5,5-trimethyl hexanoyl peroxide, octanoyl peroxide, lauryl peroxide, stearoyl peroxide, succinic acid peroxide, benzoyl peroxide, 3,5,5-trimethyl hexanoyl peroxide, benzoyl peroxy toluene, 1,1,3,3-tetramethyl butyl peroxy neodecanoate, 1-cyclohexyl-1-methylethyl peroxy neodecanoate, di-n-propyl peroxy dicarbonate, di-isopropyl peroxy carbonate, bis (4-t-butyl cyclohexyl) peroxy dicarbonate, di-2-ethoxy methoxy peroxy dicarbonate, di(2-ethyl hexyl peroxy)dicarbonate, dimethoxy butyl peroxy dicarbonate, di(3-methyl-3-methoxy butyl peroxy)dicarbonate, 1,1-bis(t-hexyl peroxy)-3,3,5-trimethylcyclohexane, 1,1-bis(t-hexyl peroxy) cyclohexane, 1,1-bis(t-butyl peroxy)-3,3,5-trimethylcyclohexane, 1,1-(t-butyl peroxy)cyclododecane, 2,2-bis(t-butyl peroxy)decane, t-butyl trimethyl silyl peroxide, bis(t-butyl)dimethyl silyl peroxide, t-butyl triallyl silyl peroxide, bis(t-butyl)diallyl silyl peroxide, and tris(t-butyl) allyl silyl peroxide.

In an implementation, the organic peroxide may have a half-life of 5 to 15 hours at 40° C. to 100° C. Within this range, the anisotropic conductive film may have a long shelf life at room or ambient temperature and may exhibit rapid curability.

In an implementation, the curing initiator may be present in the anisotropic conductive film composition in an amount of 1 wt % to 10 wt %, e.g., 1.5 wt % to 5 wt %. Within this range, the anisotropic conductive film may exhibit excellent compression properties and reworkability while preventing bubbling.

The anisotropic conductive film may further include organic particles. Organic particles may help compensate for excess flowability of the film composition due to ethylene-vinyl acetate copolymer. In addition, organic particles may help relieve stress during thermal contraction caused by curing and reduce thermal deformation due to contraction and expansion, thereby imparting adhesion reliability to the film under high temperature/high humidity conditions.

The organic particles may include at least one of, e.g., styrene-divinyl benzene, chlorinated polyethylene, dimethyl polysiloxane, methylmethacrylate-butylacrylate-dimethylsiloxane copolymer, styrene-butadiene-styrene block copolymer, styrene-butadiene thermoplastic elastomer, butadiene rubber, styrene-butadiene rubber, and ethylene glycidyl methacrylate.

The organic particles may have a monolayer structure or a multilayer structure. Examples of monolayer organic particles may include spherical organic particles formed of a crosslinked urethane resin. The polyurethane organic particles may be subjected to ion exchange treatment. Ion exchange treatment of the polyurethane organic particles may be generally performed by dilution with a solvent or in the presence of a monomer in which ion residues are not formed. When the polyurethane organic particles are subjected to ion exchange treatment, the ion content of the polyurethane organic particles may be reduced to higher than 0 ppm to 10 ppm. Within this range, it is possible to prevent increase in electrical conductivity of the film and to avoid corrosion in circuit connection. Multilayer organic particles may have a bilayer or trilayer structure including a core and a shell. Examples of bilayer organic particles may include organic particles in which a polymer resin constituting a core has a lower glass transition temperature than a polymer resin constituting a shell. Examples of the bilayer organic particles may include organic particles in which a core of the organic particle is composed of a rubbery polymer having a low glass transition temperature, such as a homopolymer or copolymer of an acrylic monomer, and a shell is composed of a polymer having a high glass transition temperature. In such organic particles, the shell having a high glass transition temperature may help suppress fusion between particles and may help improve compatibility with a matrix resin and thus allows easy dispersion of particles and viscosity control through organic particles, thereby securing liquid-phase stability and thus sufficient workability. Suitable acrylic monomers may be used to form the multilayer organic particles.

In an implementation, the diameter of the organic particles may be 0.1 µm to 10 µm, e.g., 0.3 µm to 5 µm. Within this range, the organic particles may be easily dispersed without adversely affecting conductivity of conductive particles.

The organic particles may be present in the anisotropic conductive film composition in an amount of 1 wt % to 20 wt %, in terms of solid content. Maintaining the amount of the organic particles at 1 wt % or greater may help ensure that the organic particles provide the aforementioned effects. Maintaining the amount of the organic particles at 20 wt % or less helps prevent a reduction in adhesion of the film and thus helps prevent a deterioration in preliminary compression properties.

In an implementation, the anisotropic conductive film may include organic particles containing methyl methacrylates, copolymers or methyl methacrylates of polystyrene and divinyl benzene, or copolymers of polystyrene and butadiene.

The conductive particles may include suitable conductive particles. Examples of the conductive particles may include: metal particles such as Au, Ag, Ni, Cu, and solder particles; carbon particles; polymer particles obtained by coating a polymer resin, such as polyethylene, polypropylene, polyester, polystyrene, and polyvinyl alcohol, or a modification thereof, with a metal such as Au, Ag, and Ni; particles obtained through insulation treatment of surfaces of the polymer particles with insulating particles, and the like. The conductive particles may have a size of, e.g., 5 µm to 25 µm or 6 µm to 23 µm, depending upon a pitch of a circuit to be used.

The conductive particles may be present in the anisotropic conductive film in an amount of 1 wt % to 20 wt %, in terms of solid content. Within this range, the anisotropic conductive film may exhibit stable electrical properties to prevent short circuit, and the like. In an implementation, the conductive particles may be present in the anisotropic conductive film composition in an amount of 2 wt % to 15 wt %, e.g., 3 wt % to 10 wt %, in terms of solid content.

In addition, the anisotropic conductive film may further include additives, e.g., polymerization inhibitors, antioxidants, and heat stabilizers, in order to impart additional properties without deterioration in fundamental properties. In an implementation, the additive may be present in the anisotropic conductive film composition in an amount of 0.01 wt % to 10 wt %, in terms of solid content.

The polymerization inhibitors may be selected from, e.g., hydroquinone, hydroquinone monomethyl ether, p-benzoquinone, phenothiazine, and mixtures thereof. The antioxidants may include, e.g., phenolic compounds, hydroxycinnamate compounds, and the like. Examples of the antioxidants may include tetrakis-(methylene-(3,5-di-t-butyl-4-hydroxycinnamate)methane, 3,5-bis(1,1-dimethylethyl)-4-hydroxybenzenepropanoic acid thioldi-2,1-ethanediyl ester, and the like.

A suitable apparatus or equipment may be used to form the anisotropic conductive film. For example, the anisotropic conductive film may be formed by dissolving the anisotropic conductive film composition in an organic solvent such as toluene, stirring the dissolved composition at a certain rate for a predetermined period of time so as not to pulverize conductive particles, applying the composition to a certain thickness of, for example, 10 µm to 50 µm, onto a release film, and drying the composition for a sufficient time to volatilize the organic solvent.

In accordance with a another embodiment, there is provided a display device connected by an anisotropic conductive film which includes a binder resin having a glass transition temperature of −10° C. to 90° C. and a weight average molecular weight of 90,000 g/mol or less; a radical polymerizable material that includes 2-hydroxy-3-phenoxypropyl acrylate; a curing initiator; and conductive particles, and has a second z-axis length variation rate of −10% to 60%, as measured using a thermo-mechanical analyzer and calculated according to Equation 2.

Yet another embodiment relates to a display device which includes a first connection member including a first electrode; a second connection member including a second electrode; and an anisotropic conductive film disposed between the first connection member and the second connection member and connecting the first electrode to the second electrode, wherein the anisotropic conductive film is the anisotropic conductive film according to an embodiment.

Here, the first connection member may be, e.g., a chip on film (COF) or a flexible printed circuit board (fPCB), and the second connection member may be, e.g., a glass panel, a printed circuit board (PCB), or a flexible printed circuit board (fPCB).

Referring to FIG. 2, a display device 30 may include a first connection member 50 including a first electrode 70, a second connection member 60 including a second electrode 80, and an anisotropic conductive adhesive layer including conductive particles 3 as set forth above, wherein the first connection member 50 and the second connection member may be bonded to each other through the anisotropic conductive adhesive layer disposed between the first connection member and the second connection member and connecting the first electrode to the second electrode. In an implementation, electrodes may be arranged at a pitch of 100 µm to 1500 µm, e.g., 200 µm to 500 µm, in the longitudinal direction of the anisotropic adhesive film.

Next, the present invention will be described in more detail with reference to some examples. However, it should be understood that these examples are provided for illustration only and are not to be construed in any way as limiting the present invention.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1: Preparation of Anisotropic Conductive Film

A urethane resin (weight average molecular weight: 20,000 g/mol to 35,000 g/mol, Tg: 10° C.), 2-hydroxy-3-phenoxypropyl acrylate, organic peroxides 1 and 2, and conductive particles were dissolved and dispersed in toluene, as a solvent, in a planetary mixer to prepare a film composition. Then, the composition was coated onto a release-treated polyethylene terephthalate (PET) film, followed by volatilization of the solvent in a hot air-circulated oven at 60° C. for 5 minutes, thereby obtaining a 35 μm thick anisotropic conductive film.

Example 2: Preparation of Anisotropic Conductive Film

An anisotropic conductive film was prepared in the same manner as in Example 1 except that, as a binder resin, the urethane resin and a phenoxy resin (weight average molecular weight: 75,000 g/mol, Tg: 70° C.) were used.

Example 3: Preparation of Anisotropic Conductive Film

An anisotropic conductive film was prepared in the same manner as in Example 1 except that a binder resin, the urethane resin and a phenoxy resin (weight average molecular weight: 75,000 g/mol, Tg: 70° C.) were used, and as a radical polymerizable material, tricyclodecane dimethanol diacrylate (TCDDMA) (KARAYAD R-684, Nippon Kayaku) was used in addition to 2-hydroxy-3-phenoxypropyl acrylate.

Example 4: Preparation of Anisotropic Conductive Film

An anisotropic conductive film was prepared in the same manner as in Example 3 except that amounts of 2-hydroxy-3-phenoxypropyl acrylate and tricyclodecane dimethanol diacrylate were changed as shown in Table 1.

Comparative Example 1: Preparation of Anisotropic Conductive Film

An anisotropic conductive film was prepared in the same manner as in Example 1 except that, as a binder resin, a phenoxy resin (weight average molecular weight: 75,000 g/mol, Tg: 70° C.) was used instead of the urethane resin, and as a radical polymerizable material, tricyclodecane dimethanol diacrylate (TCDDMA) (KARAYAD R-684, Nippon Kayaku) was used in addition to 2-hydroxy-3-phenoxypropyl acrylate.

Comparative Example 2: Preparation of Anisotropic Conductive Film

An anisotropic conductive film was prepared in the same manner as in Example 1 except that, as a radical polymerizable material, tricyclodecane dimethanol diacrylate (TCD-DMA) (KARAYAD R-684, Nippon Kayaku) was used instead of 2-hydroxy-3-phenoxypropyl acrylate.

Details of the components used in Examples and Comparative Examples are as follows:

1) Urethane Resin

The urethane resin was prepared using 60 wt % of polyol (polytetramethylene glycol), 13.53 wt % of 1,4-butanediol, 26.14 wt % of toluene diisocyanate, and 0.3 wt % of hydroxyethyl methacrylate, and 0.03 wt % of dibutyltin dilaurate as a catalyst. First, polyol, 1,4-butanediol, and toluene diisocyanate were reacted to prepare an isocyanate group-terminated prepolymer. Then, the prepared isocyanate group-terminated prepolymer was reacted with hydroxyethyl methacrylate, thereby preparing a polyurethane acrylate resin. Here, a mole ratio of hydroxyethyl methacrylate to the isocyanate group-terminated prepolymer was 0.5. Specifically, polyaddition polymerization was performed in the presence of dibutyltin dilaurate, as a catalyst, under conditions of 90° C. and 1 atm for a reaction time of 5 hours, thereby preparing a polyurethane acrylate resin (Tg: 10° C.) having a weight average molecular weight of 20,000 g/mol to 35,000 g/mol.

2) Phenoxy Resin 80 g of a bisphenol A type phenoxy resin was dissolved in a solvent in which bistoluene and methylethyl ketone were mixed in a weight ratio of 2:1, thereby preparing a solution having a solid content of 40 wt % (YP-50, Tohdo Kasei, molecular weight 75,000 g/mol, Tg: 70° C.)

3) Radical Polymerizable Material 1

2-hydroxy-3-phenoxypropyl acrylate (KARAYAD R-128H, Nippon Kayaku)

4) Radical Polymerizable Material 2

Tricyclodecane dimethanol diacrylate (TCDDMA) (KARAYAD R-684, Nippon Kayaku)

5) Organic Peroxide 1

Benzoyl peroxide (Hansol Chemical)

6) Organic Peroxide 2

Lauryl peroxide (Hansol Chemical)

7) Conductive Particles

Conductive particles having a size of 10 μm (13GNR10MX, NCI Co., Ltd.)

Details of components used in Examples and Comparative Examples are shown in Table 1, in which each component is shown based on percent by weight (wt %).

TABLE 1

|  | Example 1 | Example 2 | Example 3 | Example 4 | Comparative Example 1 | Comparative Example 2 |
| --- | --- | --- | --- | --- | --- | --- |
| Urethane resin (weight average molecular weight: 20,000 to 35,000 g/mol, Tg: 10° C.) | 62 | 31 | 31 | 31 |  | 62 |
| Phenoxy resin (weight average molecular weight: 75,000 g/mol, Tg: 70° C.) |  | 31 | 31 | 31 | 77 |  |
| 2-hydroxy-3-phenoxypropyl acrylate | 30 | 30 | 20 | 10 | 5 |  |
| Tricyclodecane dimethanol diacrylate |  |  | 10 | 20 | 10 | 30 |

TABLE 1-continued

|  | Example 1 | Example 2 | Example 3 | Example 4 | Comparative Example 1 | Comparative Example 2 |
| --- | --- | --- | --- | --- | --- | --- |
| Organic peroxide 1 | 1.5 | 1.5 | 1.5 | 1.5 | 1.5 | 1.5 |
| Organic peroxide 2 | 1.5 | 1.5 | 1.5 | 1.5 | 1.5 | 1.5 |
| Conductive particles | 5 | 5 | 5 | 5 | 5 | 5 |
| Total | 100 | 100 | 100 | 100 | 100 | 100 |

Each of the anisotropic conductive films prepared in Examples 1 to 4 and Comparative Examples 1 to 2 were tested under the following conditions. Results are shown in Table 2.

Experimental Example: Measurement on Anisotropic Conductive Film Using Thermo-Mechanical Analyzer For each of the prepared anisotropic conductive film prepared in Examples 1 to 4 and Comparative Examples 1 to 2, the first length variation rate (%) according to Equation 1 was measured using a thermo-mechanical analyzer (Q20model, TA Instruments) under conditions of a pressure of 0.05 N and a heating rate of 10° C./min. Results are shown in Table 2.

First $z$-axis length variation rate=$[(L_1-L_0)/L_0] \times 100$ (%) <Equation 1>

$L_0$ is a z-axis length of the anisotropic conductive film at a heating start temperature, and $L_1$ is a maximum z-axis length of the anisotropic conductive film at 130° C. to 170° C. after being heated, as measured using the thermo-mechanical analyzer.

In addition, for each of the anisotropic conductive films prepared in Examples 1 to 4 and Comparative Examples 1 to 2, the second length variation rate (%) according to Equation 2 was measured using a thermo-mechanical analyzer under conditions of a pressure of 0.05 N and a heating rate of 10° C./min. Results are shown in Table 2.

<Equation 2>

Second $z$-axis length variation rate=$[(L_2-L_0)/L_0] \times 100$ (%) (2), $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and then cooled to 20° C.

than 10%, as calculated according to Equation 1 and a second z-axis length variation rate (%) of less than −10%, as calculated according to Equation 2, and thus significantly contracted in the z-axis direction during curing and exhibited high thickness variation rate during cooling. In addition, the anisotropic conductive film of Comparative Example 2 not including 2-hydroxy-3-phenoxypropyl acrylate did not expand but contracted during curing, and thus had a first z-axis length variation rate (%) of −7.6%, as calculated according to Equation 1 and also had a second z-axis length variation rate (%) of less than −10%, as calculated according to Equation 2.

Experimental Example: Property Evaluation of Anisotropic Conductive Film

Minimum melt viscosity, adhesive strength, bubble area in a space portion each of the anisotropic conductive films prepared in Examples 1 to 4 and Comparative Examples 1 to 2 were measured under the following conditions. Results are shown in Table 3.

Measurement of Minimum Melt Viscosity

Minimum melt viscosity of each of the anisotropic conductive films was measured on a parallel plate and a disposable aluminum plate (diameter: 8 mm) using an ARES G2 rheometer (TA Instruments) under conditions of a temperature elevation rate of 10° C./min, a strain of 5%, and a frequency of 1 rad/sec in a temperature zone from 30° C. to 200° C.

Measurement of Adhesive Strength

Each of the anisotropic conductive films prepared in Examples 1 to 4 and Comparative Examples 1 to 2 was compressed under the following compression conditions between a printed circuit board (PCB) (pitch: 300 μm, terminal width: 150 μm, distance between terminals: 150 μm, terminal height: 35 μm) and a chip on film (COF) (pitch: 300 μm, terminal width: 150 μm, distance between terminals: 150 μm, terminal height: 8 μm).

TABLE 2

|  | Example 1 | Example 2 | Example 3 | Example 4 | Comparative Example 1 | Comparative Example 2 |
| --- | --- | --- | --- | --- | --- | --- |
| $[(L_1 - L_0)/L_0] \times 100$ (%) | 53.4 | 82.5 | 42.1 | 35.7 | −15.3 | −7.6 |
| $[(L_2 - L_0)/L_0] \times 100$ (%) | 21.4 | 57.1 | 11.3 | −7.3 | −27.7 | −16.5 |

As shown in Table 2, the anisotropic conductive films of Examples 1 to 4 had a first z-axis length variation rate (%) of 10% to 90%, as calculated according to Equation 1 and a second z-axis length variation rate (%) of −10% to +60%, as calculated according to Equation 2, and thus sufficiently expanded in the z-axis direction during heating and exhibited low thickness variation rate during cooling. On the contrary, the anisotropic conductive film of Comparative Example 1 had a first z-axis length variation rate (%) of less 1) Preliminary compression conditions; 70° C., 1 sec, 1 MPa 2) Main compression conditions; 150° C., 5 sec, 3.0 MPa Then, adhesive strength of each of the anisotropic conductive films was measured using a peel strength meter (H5KT, Tinius Olsen Co., Ltd.) under conditions of a peeling angle of 90° and a peeling speed of 50 mm/min.

Measurement of Initial Bubble Area in a Space Portion and Bubble Area in a Space Portion after Reliability Evaluation Each of the anisotropic conductive film samples prepared in Examples 1 to 4 and Comparative Examples 1 to 2 was left at room temperature (25° C.) for 1 hour, and compressed between a patternless glass substrate obtained by coating 0.5 t glass with a 1,000 Å indium-tin oxide (ITO) layer and a chip on film (COF) (Samsung Electronics) having a pattern measurable by a 4-point probe method under preliminary compression conditions of 70° C., 1 second and 1 MPa and main compression conditions of 150° C., 5 second and 3.0 MPa, thereby preparing 10 specimens per sample. Images of the prepared specimens were obtained using an optical microscope, and then, for each specimen, a ratio (%) of bubble area in a space between electrodes to total area of the space was measured using an image analyzer, followed by averaging the measured values.

Thereafter, each of 10 specimens was left at 85° C. and 85% RH for 500 hours for high temperature/high humidity reliability evaluation, followed by measuring a rate (%) of bubble area in the same manner as above and averaging the measured values.

TABLE 3

|  | Example 1 | Example 2 | Example 3 | Example 4 | Comparative Example 1 | Comparative Example 2 |
|---|---|---|---|---|---|---|
| Minimum melt viscosity (Pa · sec) | 4,000 | 8,500 | 8,400 | 7,500 | 3,500 | 5,000 |
| Adhesive strength (gf/cm) | 1233 | 957 | 1035 | 979 | 835 | 615 |
| Initial bubble area in a space portion (%) | 7 | 0 | 2 | 5 | 67 | 40 |
| Bubble area in a space portion after reliability evaluation (%) | 7 | 5 | 7 | 9 | 97 | 85 |

As shown in Table. 3, the anisotropic conductive films of Examples 1 to 4 had a minimum melt viscosity of 20,000 Pa·sec or less and an adhesive strength of 500 gf/cm or higher and exhibited a low ratio of initial bubble area in the space and a low ratio of bubble area in the space after reliability evaluation. On the contrary, the anisotropic conductive films of Comparative Examples 1 to 2 exhibited a high ratio of initial bubble area in the space and a high ratio of bubble area in the space after reliability evaluation.

By way of summation and review, with the trend of increase in panel size and wire width, a space between electrodes may be widened. As a result, as a connection substrate expands due to compression by heat and pressure upon bonding and then contracts again after bonding, an adhesive composition or adhesive may undergo considerable expansion and contraction and may experience significant bubbling, thereby causing deterioration in filling effects of the adhesive or adhesive composition. For example, in the case of printed circuit boards (PCBs) or indium-tin oxide (ITO) films for touch screen panels (TSPs) having an electrode pitch of 200 µm or greater, when an adhesive or adhesive composition is compressed between a chip on film (COF) and a flexible printed circuit (FPC), compression of a space between electrodes may be severe, thereby causing "spring back" in which the film is attached to and then detached from the adhesive. As a result, the adhesive may be more likely to experience bubbling.

To address such issues, fine grains may be used to reduce thermal deformation due to contraction and expansion of ACFs, thereby reducing bubbling while improving adhesion.

The embodiments may provide a display device connected by an anisotropic conductive film that includes a suitable amount of 2-hydroxy-3-phenoxypropyl acrylate (a monomer exhibiting low contraction) between upper and lower electrodes in a vertical direction, and thus may help reduce and/or prevent bubbling both after curing and after reliability evaluation, thereby exhibiting excellent reliability.

The embodiments may provide an anisotropic conductive film that allows control of contraction behavior in a z-axis direction or can expand in the z-axis direction during curing, thereby reducing generation of bubbles in a space between electrodes while exhibiting excellent adhesive strength and reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising: an electrical connection connected by an anisotropic conductive film, wherein the anisotropic conductive film has a first z-axis length variation rate of 10% to 90%, as measured using a thermo-mechanical analyzer and calculated according to Equation 1:

$$\text{first } z\text{-axis length variation rate} = [(L_1 - L_0)/L_0] \times 100 \, (\%) \quad (1),$$

wherein, $L_0$ is a z-axis length of the anisotropic conductive film at a heating start temperature, and $L_1$ is a maximum z-axis length of the anisotropic conductive film at 130° C. to 170° C. after being heated, as measured using the thermo-mechanical analyzer, wherein the anisotropic conductive film is prepared from a composition that includes:
a binder resin;
2-hydroxy-3-phenoxypropyl acrylate;
a curing initiator; and
conductive particles, and
wherein the 2-hydroxy-3-phenoxypropyl acrylate is present in the composition in an amount of 10 wt % to 50 wt %, in terms of solid content of the composition.

2. The display device as claimed in claim 1, wherein the anisotropic conductive film has a second z-axis length variation rate of −10% to +60%, as measured using a thermo-mechanical analyzer and calculated according to Equation 2:

$$\text{second z-axis length variation rate} = [(L_2-L_0)/L_0] \times 100 \,(\%) \quad (2),$$

wherein, $L_0$ is the z-axis length of the anisotropic conductive film at the heating start temperature, and $L_2$ is a z-axis length of the anisotropic conductive film at 25° C., as measured using the thermo-mechanical analyzer after being heated to 220° C. and cooled to 20° C.

3. The display device as claimed in claim 1, wherein the anisotropic conductive film has a minimum melt viscosity of 20,000 Pa·sec or less.

4. The display device as claimed in claim 1, wherein the anisotropic conductive film has an adhesive strength of 500 gf/cm or more, as measured after preliminary compression under conditions of 70° C., 1.0 MPa and 1 second and main compression under conditions of 150° C., 3.0 MPa and 5 second.

5. The display device as claimed in claim 1, wherein the anisotropic conductive film has a ratio of bubble area in a space between electrodes to total area of the space of 15% or less, as measured after being left at 85° C. and 85% RH for 500 hours subsequent to preliminary compression under conditions of 70° C., 1.0 MPa and 1 second and main compression under conditions of 150° C., 3.0 MPa and 5 second.

6. The display device as claimed in claim 1, wherein the binder resin has a glass transition temperature of −10° C. to 90° C.

7. The display device as claimed in claim 1, wherein a weight ratio of the binder resin to the 2-hydroxy-3-phenoxypropyl acrylate is 8:1 to 1:1.

8. The display device as claimed in claim 1, wherein the binder resin has a weight average molecular weight of 90,000 g/mol or less.

9. The display device as claimed in claim 8, wherein the binder resin includes at least two binder resins having different molecular weights.

10. The display device as claimed in claim 9, wherein the binder resin includes:
at least one binder resin having a weight average molecular weight of 20,000 g/mol to 50,000 g/mol, and
at least one binder resin having a weight average molecular weight of greater than 50,000 g/mol to 90,000 g/mol.

11. A display device, comprising: an electrical connection connected by an anisotropic conductive film, wherein the anisotropic conductive film is prepared from a composition that includes:
a binder resin having a glass transition temperature of −10° C. to 90° C. and a weight average molecular weight of 90,000 g/mol or less;
a radical polymerizable material that includes 2-hydroxy-3-phenoxypropyl acrylate, the 2-hydroxy-3-phenoxypropyl acrylate being present in the composition in an amount of 10 wt % to 50 wt %, in terms of solid content of the composition;
a curing initiator; and
conductive particles, and
wherein the anisotropic conductive film has a z-axis length variation rate of −10% to 60%, as measured using a thermo-mechanical analyzer and calculated according to Equation 2:

$$\text{z-axis length variation rate} = [(L_2-L_0)/L_0] \times 100 \,(\%) \quad (2),$$

wherein, $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and cooled to 20° C.

12. The display device as claimed in claim 11, wherein a weight ratio of the binder resin to the 2-hydroxy-3-phenoxypropyl acrylate is 8:1 to 1:1.

13. The display device as claimed in claim 11, wherein the composition includes:
20 wt % to 70 wt % of the binder resin;
the 10 wt % to 50 wt % of the 2 hydroxy-3-phenoxypropyl acrylate;
1 wt % to 10 wt % of the curing initiator; and
1 wt % to 20 wt % of the conductive particles, wherein the wt % is in terms of solid content of the composition.

14. An anisotropic conductive film, comprising:
a binder resin having a glass transition temperature of −10° C. to 90° C. and a weight average molecular weight of 90,000 g/mol or less;
a radical polymerizable material that includes 2-hydroxy-3-phenoxypropyl acrylate, the 2-hydroxy-3-phenoxypropyl acrylate being present in the composition in an amount of 10 wt % to 50 wt %, in terms of solid content of the composition;
a curing initiator; and
conductive particles, and
wherein the anisotropic conductive film has a z-axis length variation rate of −10% to 60%, as measured using a thermo-mechanical analyzer and calculated according to Equation 2:

$$\text{z-axis length variation rate} = [(L_2-L_0)/L_0] \times 100 \,(\%) \quad (2),$$

wherein, $L_0$ is a z-axis length of the anisotropic conductive film at a heating start temperature, and $L_2$ is a z-axis length of the anisotropic conductive film at 25° C., as measured using the thermo-mechanical analyzer after being heated to 220° C. and cooled to 20° C.

* * * * *